United States Patent [19]
Schilling et al.

[11] Patent Number: 5,862,168
[45] Date of Patent: Jan. 19, 1999

[54] MONOLITHIC INTEGRATED OPTICAL SEMICONDUCTOR COMPONENT

[75] Inventors: Michael Schilling; Gert Laube, both of Stuttgart, Germany

[73] Assignee: Alcatel Alsthom, Paris, France

[21] Appl. No.: 845,999

[22] Filed: Apr. 25, 1997

[30] Foreign Application Priority Data

May 15, 1996 [DE] Germany ............................ 19619533.0

[51] Int. Cl.$^6$ ............................... H01S 3/19; G02B 6/12; H01L 21/20
[52] U.S. Cl. ................................ 372/50; 372/43; 372/45; 385/14; 437/51; 437/129
[58] Field of Search ................................. 372/11, 12, 21, 372/22, 43, 45, 50, 69, 70, 75, 92, 109; 385/14; 437/15, 51, 129

[56] References Cited

U.S. PATENT DOCUMENTS

| | | | |
|---|---|---|---|
| 5,140,149 | 8/1992 | Sakata et al. | 372/50 X |
| 5,220,573 | 6/1993 | Sakata et al. | 372/50 |
| 5,309,465 | 5/1994 | Antreasyan et al. | 372/43 |
| 5,359,679 | 10/1994 | Tanaka et al. | 385/8 |
| 5,657,338 | 8/1997 | Kitamura | 372/50 |
| 5,678,935 | 10/1997 | Sakata | 372/50 X |
| 5,721,750 | 2/1998 | Kwon et al. | 372/44 |
| 5,771,257 | 6/1998 | Takiguchi et al. | 372/50 |

FOREIGN PATENT DOCUMENTS

| | | | |
|---|---|---|---|
| 0606093 | 7/1994 | European Pat. Off. | 372/50 X |
| 0643461 | 3/1995 | European Pat. Off. | 372/50 X |

OTHER PUBLICATIONS

Patent Abstracts of Japan 05027279, Feb. 5, 1993, and Japanese Patent Application 03181228, Jul. 22, 1991.

"DFB Lasers with Monolithically Integrated Passive Waveguide", T. Tanbun–Ek et al, *IEEE Photonics Technology Letters*, 4(1992) Jul., No. 7, New York, pp. 685–688.

"Multiwavelength Light Source with IntegratedDFB Laser Array and Star Coupler for WDM Lightwave Communications", C. Zah et al, *International Journal of High Speed Electronics and Systems*, 5(1994) Mar., No. 1, London, pp. 91–1091.

*Primary Examiner*—Brian Healy
*Attorney, Agent, or Firm*—Ware, Fressola, Van Der Sluys & Adolphson LLP

[57] ABSTRACT

Monolithic integrated optical semiconductor components with a buried ridge stripe waveguide (BRS) are used for optical communications. They contain active (AB) and passive (PB) waveguide regions. High absorption losses occur in passive waveguide regions with a buried ridge stripe waveguide, while passive waveguide regions with low-loss rib waveguides have reflections and leakage losses in the junction with the active waveguide regions. A semiconductor component (BE2) according to the invention has a buried ridge stripe waveguide (BRS) in active (AB) as well as passive (PB) waveguide regions, which is covered by a cap layer (DS). In addition the passive regions (PB) have a semi-insulating or undoped cladding layer (MS) between the ridge stripe waveguide (BRS) and the cap layer (DS). A process is furthermore indicated whereby a semiconductor component according to the invention can be manufactured.

10 Claims, 4 Drawing Sheets

5,862,168

MONOLITHIC INTEGRATED OPTICAL SEMICONDUCTOR COMPONENT

BACKGROUND OF THE INVENTION

1. Field of the Invention

The invention concerns a monolithic integrated optical semiconductor component and a process for fabricating an optical semiconductor device.

2. Description of the Related Art

Such a semiconductor component is used for producing, regenerating and processing signals, or for switching signals in optical communications, particularly in optical transmission networks which operate mostly without any optoelectronic signal conversion. To that end active waveguide regions are monolithically integrated in the semiconductor component, such as e.g. lasers, switches, modulators, amplifiers or detectors with passive waveguide regions, such as e.g. passive optical waveguides, branching points, filters or couplers.

A laser with a buried ridge stripe waveguide, which is monolithically integrated with a passive waveguide, is known from an article by D. Remiens et al ("Buried Ridge Stripe Lasers Monolithically Integrated with Butt-Coupled Passive Waveguides for OEIC", *SPIE*, Vol. 1362, pages 323–330). The passive waveguide is also a buried ridge stripe waveguide which is covered by a p-doped cap layer. However high absorption losses in the passive waveguide are a disadvantage. In addition the laser is manufactured in accordance with a process comprising several steps which require the laser to be precisely aligned with lithographic masks.

Furthermore a monolithic integrated optical semiconductor component with active and passive waveguide regions is known from the publication of the European patent application EP 616 243 A from which U.S. patent applications having Ser. Nos. 08/198,830 filed Feb. 18, 1994 and 08/474,686 filed Jun. 7, 1995 claim priority. It describes a cascaded optical space switch which has a ridge stripe waveguide in both the active as well as the passive waveguide regions. Furthermore a process is indicated whereby this ridge stripe waveguide can be applied in a single coating process. A cap layer is not described in EP 616 243 A.

In many state of the art applications the monolithic integrated optical semiconductor components preferably use buried ridge stripe waveguides in the active waveguide regions. As is known e.g. from U. Koren et al, "Semi-Insulating Blocked Planar BH GaInAsP/InP Laser with High Power and High Modulation Bandwidth", *Electr. Letters*, Vol. 24, No. 3, 4th Feb. 1988, this waveguide structure is suitable above all for lasers because of the low threshold current, the achievable high output and the long service life, but it is also used for integrated amplifiers and switches. In contrast, as is known e.g. from T. Koch et al, "Semiconductor Photonic Integrated Circuits", IEEE *J. Quant. Electr.*, Vol. 27, No. 3, 1991, the use of rib waveguides is preferred in the passive waveguide regions due to their low absorption losses. But the integration of different optical waveguide structures leads to technologically expensive manufacturing processes, and additional leakage losses and reflections occur in the junctions between the active and the passive waveguide regions having different waveguide structures.

SUMMARY OF INVENTION

It is therefore the task of the invention to present a monolithic integrated optical semiconductor component with low absorption losses which has the same waveguide structure in the active and the passive waveguide regions.

It is furthermore the task of the invention to present a process for manufacturing such a semiconductor component.

According to a first aspect of the present invention, a monolithic integrated optical semiconductor device designed for light signals of an operating wavelength, comprising a substrate, an optical waveguide disposed on said substrate, and a doped cap layer having an absorption coefficient for light signals of the operating wavelength, wherein the optical waveguide has an active, controllably light-amplifying or light-absorbing section and a passive, nonamplifying section, and is a buried ridge stripe waveguide in both the active section and the passive section, is characterized in that in the passive section, the optical waveguide is covered by a cladding layer, the cladding layer has an absorption coefficient for light signals of the operating wavelength less than the absorption coefficient of the cap layer, and in the passive section, the cladding layer is covered by the cap layer.

According to a second aspect of the invention, a process for fabricating an optical semiconductor device having a buried ridge stripe waveguide comprising active, controllably light-amplifying or light-absorbing sections and passive, nonamplifying sections, said process comprising the steps of a) depositing a semiconductor layer structure patterned to form a ridge stripe waveguide on a substrate; b) depositing a cap layer over the entire surface of the patterned structure and a contact layer over the entire surface of the cap layer; and depositing a metal contact on the contact layer in the active sections, is characterized in that the following steps are carried out between steps a) and b): i) covering the active sections with a dielectric layer; ii) depositing a cladding layer of semi-insulating or undoped semiconductor material; and iii) removing the dielectric layer.

The component of the invention has the additional advantage that the passive waveguide regions are insulated by the cladding layer since the transition from p-doped to n-doped semiconductor layers is interrupted and therefore no parasitic currents can flow through the passive waveguide regions. This leads to improved high frequency properties of the semiconductor component, i.e. to an expanded frequency response.

These and other objects, features and advantages of the present invention will become more apparent in light of the detailed description of a best mode embodiment thereof, as illustrated in the accompanying drawing.

BRIEF DESCRIPTION OF THE DRAWING

Two configuration examples of a semiconductor component according to the invention are described in the following by means of FIGS. 1 to 7, as well as a process for manufacturing such a semiconductor component, wherein.

DETAILED DESCRIPTION OF PREFERRED EMBODIMENTS

Figure 1:
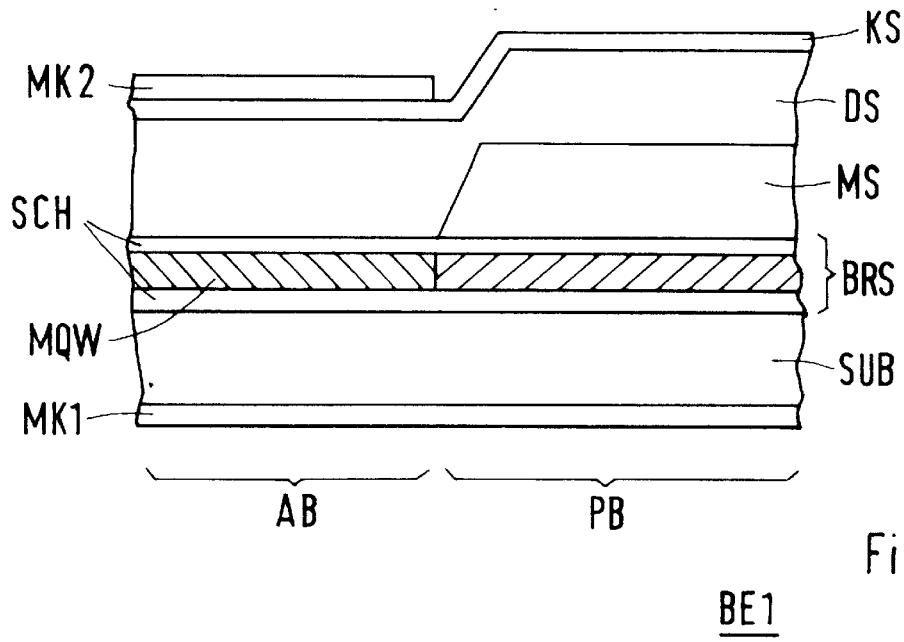
FIG. 1 is a cut through a semiconductor component in a first configuration example of the invention along the buried ridge stripe waveguide.

FIG. 1 illustrates a cross section of a first configuration example of an optical semiconductor component BE1 according to the invention. The cut runs along a ridge stripe waveguide BRS which is buried in the optical semiconductor component BE1.

The optical semiconductor component BE1 has a substrate SUB on which the ridge stripe waveguide BRS is located. This ridge stripe waveguide BRS has an active waveguide region AB with controlled light amplifying or light absorbing action, and a passive waveguide region PB which conducts unamplified light. In the passive waveguide region PB the ridge stripe waveguide is covered by a cladding layer MS.

The entire surface of the semiconductor component BE1 is covered by a cap layer DS and a contact layer KS. In addition the active waveguide region AB has a metal contact MK2 above the ridge stripe waveguide BRS on the contact layer KS. The entire underside of the substrate SUB is coated with a metal contact layer MK1.

The buried ridge stripe waveguide BRS contains at least one optically active layer MQW. This at least one optically active layer MQW preferably has a multiple-quantum-well structure, i.e. a stack of layers containing semiconductor layers with an alternating small and large energy band gap. The energy band gap is the energetic distance between the valence band and the conduction band of a semiconductor. Only discrete transitions are possible for charge carriers (electrons and holes [defect electrons]) in such a multiple-quantum-well structure, whose transition energy is called the energy band gap in the following.

The thickness of these semiconductor layers determines the size of the energy band gap and thereby the wavelength at which light is absorbed, amplified or emitted in the ridge stripe waveguide BRS. The wavelength at which light is amplified or absorbed in a controlled way in the active waveguide region is called the operating wavelength $\lambda$. In the case where the ridge stripe waveguide BRS only contains one optically active layer, the operating wavelength $\lambda$ is determined by the material composition of this layer.

The semiconductor component BE1 in the first configuration example is designed for light signals at an operating wavelength $\lambda$ of 1500 nm by correctly selecting the thicknesses of the semiconductor layers with the small and the large energy band gap. For long distance communications the operating wavelength $\lambda$ is usually in the range from 1530 nm to 1580 nm.

The energy band gap in the passive waveguide region PB is larger or smaller than in the active waveguide region AB. In this way light at the operating wavelength $\lambda$ in the passive waveguide region PB is barely or at least less strongly absorbed than would be the case with equal energy band gaps. The at least one optically active layer MQW in the active waveguide region AB of FIG. 1 is drawn with different cross-hatching than in the passive waveguide region PB to indicate the energy band gap difference.

The ridge stripe waveguide BRS furthermore contains waveguide layers SCH which include the at least one optically active layer MQW in the vertical direction to the substrate plane. These waveguide layers SCH have an index of refraction that is greater than the index of refraction of the surrounding semiconductor material composed of cap layer DS, cladding layer MS and substrate SUB. In this way a light wave is conducted in the buried ridge stripe waveguide BRS.

The cap layer DS has an absorption coefficient for light signals at the operating wavelength $\lambda$. This absorption coefficient indicates how much a light wave is weakened by absorption in the material along a predetermined path.

The cladding layer MS has an absorption coefficient which is smaller than the absorption coefficient of the cap layer DS. This means that a light wave is weakened less by absorption along the same path in the cladding layer MS material than in the cap layer DS material.

If a light wave is conducted in the ridge stripe waveguide BRS, certain portions of this light wave also propagate in the material which surrounds the ridge stripe waveguide, i.e. the material of the substrate SUB, the cap layer DS or the cladding layer MS. In the passive waveguide region PB the ridge stripe waveguide BRS is covered by the cladding layer, which has a smaller absorption coefficient than the cap layer DS covering the ridge stripe waveguide in the active waveguide region AB. This reduces absorption losses in the passive waveguide region.

As was explained, it is the task of the cladding layer MS to reduce absorption losses in the passive waveguide region PB. These absorption losses originate above all from intervalence transitions in p-doped semiconductor material which forms the cap layer DS in the configuration example. To reduce these losses, the cladding layer MS is made of undoped or semi-insulating semiconductor material. Semi-insulating semiconductor material is characterized in that it contains recombination sites for radiationless transitions, so that free charge carriers (electrons and holes) recombine in these recombination sites before they can interact with a light wave. An example of such a semi-insulating semiconductor material is Fe- or Cr-doped InP.

Since almost no current can flow through a semi-insulating or undoped semiconductor layer, a cladding layer MS made of such a semiconductor material is only deposited in the passive waveguide region PB. The cap layer DS in the active waveguide region AB directly covers the ridge stripe waveguide BRS, which is doped with the opposite conduction type as the substrate SUB. In the configuration example the substrate is n-doped.

In a particularly advantageous configuration the index of refraction of the cladding layer MS is the same as the index of refraction of the cap layer DS. In that case there is no change between the active waveguide region AB and the passive waveguide region PB in the index of refraction in the semiconductor material surrounding the buried ridge stripe waveguide BRS. This causes the properties of the light wave conduction of the buried ridge stripe waveguide BRS to be the same in the active AB and the passive PB waveguide region, and no leakage losses and reflections occur.

In a further advantageous configuration, the ridge stripe waveguide BRS in the active AB as well as the passive PB waveguide region comprises a continuous semiconductor layer structure with multiple connections which is deposited in a single coating operation, where the semiconductor layers of the multiple-quantum-well layers MQW have a heavier thickness in the active waveguide region AB than in the passive PB. The thickness of these semiconductor layers determines the energy band gap of the multiple-quantum-well structure and thereby the wavelength at which light is absorbed, emitted or amplified.

In this advantageous configuration the energy band gap of the multiple-quantum-well structure MQW is at 1550 nm in the active waveguide region AB, and at 1430 nm in the passive PB. This prevents absorption losses in light at the operating wavelength $\lambda=1550$ nm in the passive waveguide region PB.

Figure 2A:
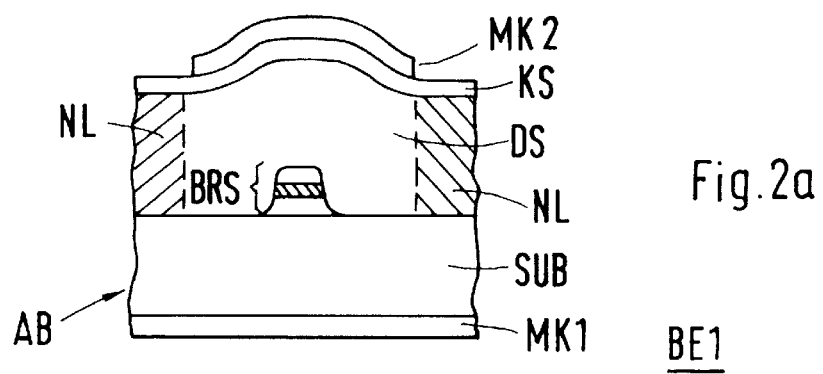
FIGS. 2a and 2b are a cut through the semiconductor component of the first configuration example, vertical to the buried ridge stripe waveguide in the active waveguide region and in the passive waveguide region.
Figure 2B:
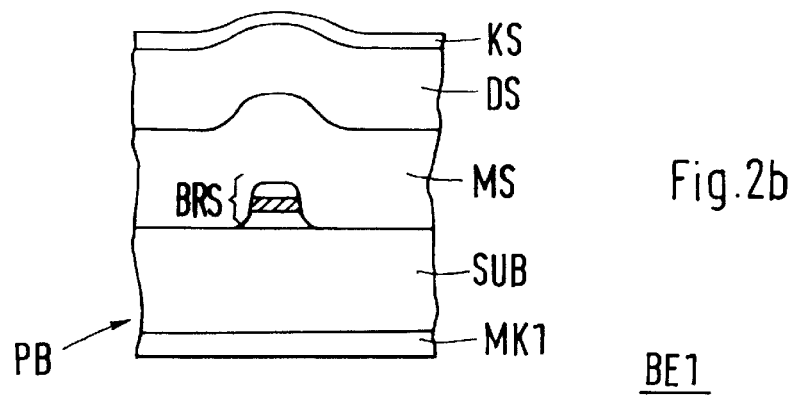

FIGS. 2a and 2b illustrate the same optical semiconductor component BE1 as FIG. 1. FIG. 2a is a cut that is vertical to the ridge stripe waveguide BRS in the active waveguide region AB, and FIG. 2b is a cut that is vertical to the ridge stripe waveguide BRS in the passive waveguide region PB.

FIG. 2a illustrates the active waveguide region AB in which the mesa-shaped ridge stripe waveguide BRS can be seen, which is placed on the substrate SUB and is completely covered by the cap layer DS. The sections NL of the cap layer DS on both sides of the ridge stripe waveguide BRS have been rendered non-conducting by ion implantation, preferably the implantation of protons, so that an operating current is restricted to the ridge stripe waveguide BRS region. The cap layer DS has a heavily doped contact layer KS and a metal contact MK2, which is applied to the contact layer KS above the ridge stripe waveguide BRS.

The passive waveguide region PB illustrated in FIG. 2b additionally contains the cladding layer MS between the cap layer DS and the ridge stripe waveguide BRS. Non-conducting sections in the cap layer DS as well as a metal contact on the contact layer KS are not provided in the passive waveguide region PB.

The substrate in the first configuration example is made of n-doped InP, the cap layer DS of p-doped InP, the contact layer of $p^+$-doped (heavily doped) InGaAsP and the waveguide and multiple-guantum-well layers of ternary or quaternary mixed crystals of the III/V compound type, such as e.g. InGaAsP, InGaAs, InGaAlAs or similar. The cladding layer MS is made of undoped or semi-insulating InP.

But other semiconductors of the III/V compound type such as Gays are also suitable as the material for the semiconductor component. Semiconductors of the II/VI or IV/IV compound type are also potential materials.

Figure 3:
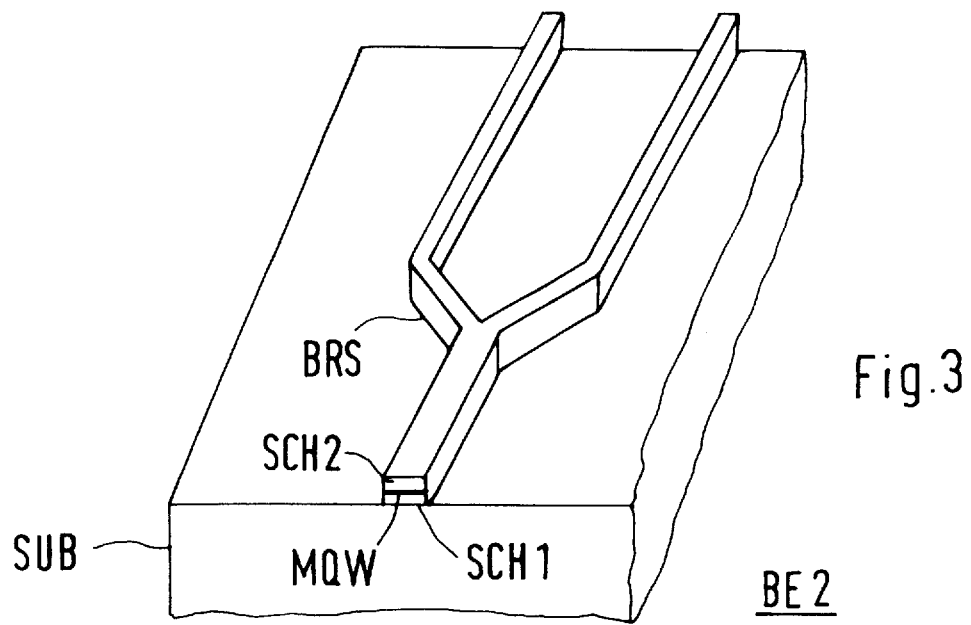
FIGS. 3 to 7 are a schematic spatial view of a semiconductor component in a second configuration example of the invention after several steps of a manufacturing process.

FIGS. 3 to 7 schematically illustrate a second configuration example of a semiconductor component BE2 of the invention after several steps of a manufacturing process of the invention. FIG. 3 illustrates a substrate SUB on which a mesa-stripe-shaped ridge waveguide BRS was applied. In the second configuration example the ridge stripe waveguide BRS forms a Y-shaped branch.

During the successful accomplishment of the first step a semiconductor layer structure is applied to the entire surface of the substrate SUB in a first partial step. In the configuration example this semiconductor layer structure comprises a first waveguide layer SCH1, an optically active layer structure with a multiple-quantum-well structure MQW and a second waveguide layer SCH2. The application of the semiconductor layer structure can take place by epitaxial precipitation of semiconductor material from the liquid phase (LPE) or id from the gas phase (MOVPE).

It is a special advantage to deposit the semiconductor layer structure with molecular beam epitaxy by means of the Gas-Source-Molecular-Beam-Epitaxy (GSMBE) process, since this process allows good control over the layer thicknesses and thereby the energy band gap of the multiple-quantum-well structure across a large coating surface, such as e.g. the surface of a 2-inch diameter wafer.

In a second partial step active and passive waveguide regions are formed from the semiconductor layer structure in a way so that the energy band gap in the active waveguide regions is different from the passive ones.

A possibility to that effect is the process known as quantum-well intermixing. In that process the parts of the semiconductor layer structure provided as passive waveguide regions are bombarded with ions during the second partial step, which produces lattice defects. Subsequently the semiconductor component BE2 is heated and tempered, which anneals most of the lattice defects. This treatment shifts the energy band gap of the multiple-quantum-well structure into shorter wavelengths. The thus formed ridge stripe waveguide BRS is a continuous part of the semiconductor layer structure having multiple connections. The result is that the finished semiconductor component BE2 contains no junctions between active and passive waveguide regions in which different semiconductor layers are connected to each other in the light propagation direction of the ridge stripe waveguide. This avoids reflections and leakage losses.

The method known as 'butt-coupling' offers another possibility. In that case the parts of the semiconductor layer structure provided as the passive waveguide regions are e.g. removed during the second partial step, and are replaced by selectively growing a new layer structure with a different energy band gap.

In a third partial step an etch mask is produced on the semiconductor layer structure by means of photolithography. The etch mask is made of photosensitive resist and covers the sections of the semiconductor layer structure from where the ridge stripe waveguide BRS is formed. The semiconductor layer structure is etched in a fourth partial step, so that a mesa-shaped ridge stripe remains as the ridge stripe waveguide BRS on the substrate SUB. This can take place e.g. by chemical wet etching with an etchant. The sections of the semiconductor layer structure that are covered by the etch mask are not removed. Subsequently the etch mask is removed with a solvent in a fifth partial step.

A further particularly advantageous configuration of the first step contains the following partial steps. In a first partial step a dielectric mask e.g. of $SiO_2$ is deposited on the substrate SUB. By photolithography and etching, e.g. with buffered fluoride, this dielectric mask is so structured that narrow stripes in which the ridge stripe waveguide will be formed remain open. In active waveguide regions the narrow stripe is laterally confined by large masked sections. The lateral confinement created by the dielectric mask is missing in passive waveguide regions, or there is only a narrow lateral dielectric mask.

In a second partial step a semiconductor layer structure is applied, which contains a first waveguide layer SCH1, a layer structure with a multiple-quantum-well structure MQW and a second waveguide layer SCH2. The metal-organic-vapor-phase-epitaxy (MOVPE) process is used, whereby the semiconductor material is precipitated from the gas phase. This takes place preferably at a pressure of 100–150 mbar. No semiconductor material is precipitated on the dielectric mask. Migration and diffusion in the gas phase directly above the dielectric mask increases the growth speed in adjacent unmasked sections of the substrate surface. Semiconductor layers in the active regions, which are laterally confined by large masked sections, therefore grow thicker than semiconductor layers in the passive regions which are not laterally confined, or only by a narrow dielectric mask. In a third partial step the dielectric mask is removed, e.g. with buffered fluoride.

The thus formed semiconductor layer structure is made of semiconductor layers which are thicker in the active waveguide regions than in the passive waveguide regions. In the second configuration example the energy band gap of the multiple-quantum-well structure MQW is therefore 1550 nm in the active waveguide regions and 1430 nm in the passive waveguide regions. The ridge stripe waveguide BRS can now be formed from the semiconductor layer structure by means of etching, using an etch mask made of photosensitive resist.

Figure 4:
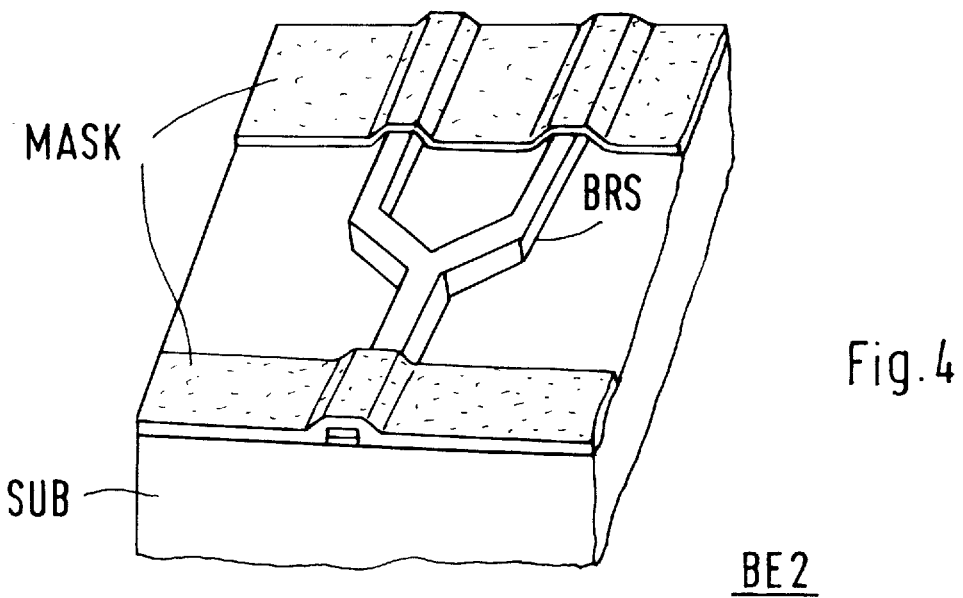

In a second step of the manufacturing process a dielectric layer MASK is deposited on the semiconductor component BE2 and is photolithographically structured so that it covers the sections of the ridge stripe waveguide designed as active regions, including the adjacent sections of the substrate surface. In that case the covered surface can be a larger by a multiple than the width of the ridge stripe waveguide BRS, as illustrated in FIG. 4. The dielectric layer MASK can e.g. be made of $SiO_2$ or SiN. FIG. 4 illustrates the semiconductor component BE2 after this second step.

Figure 5:
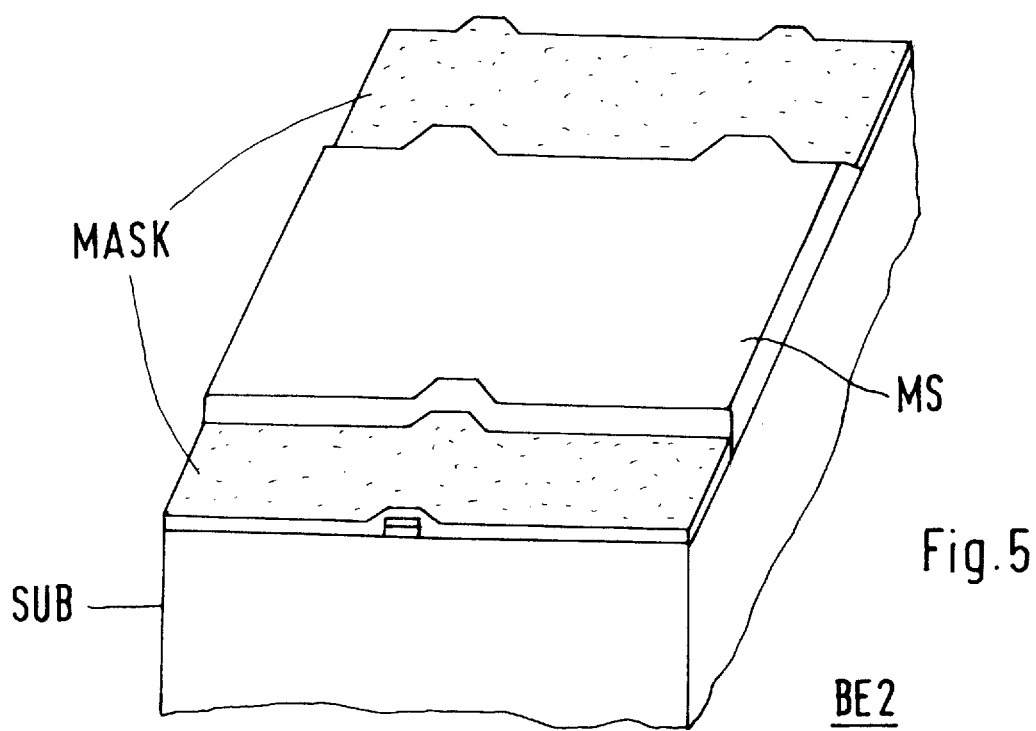

A cladding layer MS is applied in a third step. This cladding layer is made of undoped or semi-insulating semiconductor material. Particularly suited for this purpose is epitaxial precipitation from the gas phase in accordance with the MOVPE process, however liquid phases (LPE) or molecular-beam-epitaxy (GSMBE) are also suitable for precipitating the cladding layer MS. In that case no material, or only polycrystalline semiconductor material is precipitated onto the dielectric layer MASK, so that only the passive waveguide regions are covered by the cladding layer MS. FIG. 5 illustrates the semiconductor component BE2 after this third step.

Figure 6:
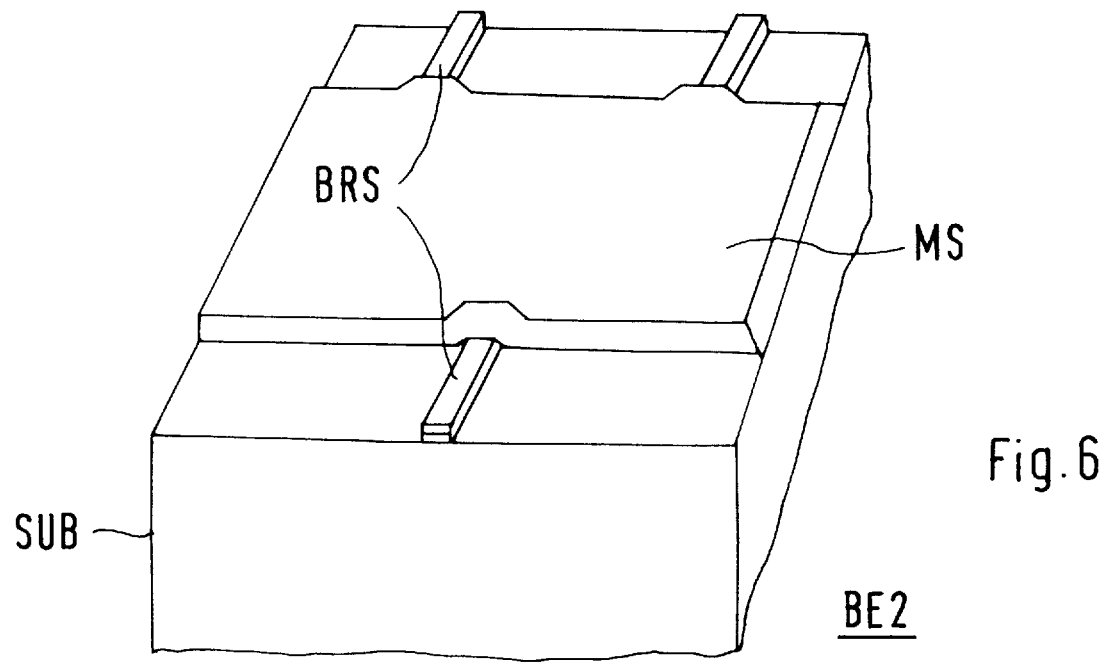

Then in a fourth step the dielectric layer MASK is removed, including possible deposits. If the dielectric layer MASK is made of $SiO_2$ for example, buffered fluoride which selectively dissolves $SiO_2$ can be used for that purpose. This step reexposes the ridge stripe waveguide BRS in the active regions. FIG. 6 illustrates the semiconductor component BE2 after this fourth step.

Figure 7:
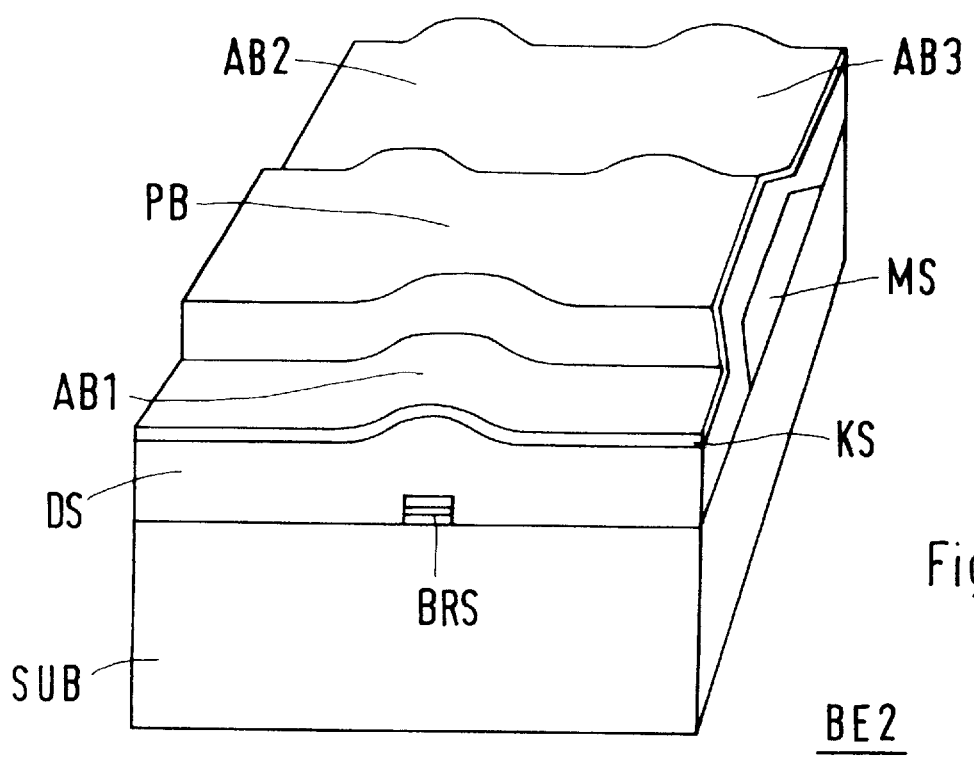

In a fifth step a cap layer DS and a contact layer KS are applied to the entire surface. This can take place e.g. with the epitaxial precipitation of semiconductor material from the liquid phase (LPE) or from the gas phase (MOVPE) or by means of molecular-beam-epitaxy (GSMBE). The cap layer DS and the contact layer KS are doped with the opposite conduction type as the substrate SUB. The ridge stripe waveguide BRS in the active waveguide regions AB1–AB3 as well as in the passive waveguide regions PB is completely covered by the cap layer DS, and the passive waveguide regions PB have the additional cladding layer MS. FIG. 7 illustrates the semiconductor component BE2 after this fifth step.

In a further step the sections of the cap layer DS on both sides of the ridge stripe waveguide BRS can be made non-conducting through the implantation of ions, preferably protons. This restricts an operating current to the section of the ridge stripe waveguide BRS and the lowers the current requirement. This step increases the quantum efficiency of a laser for example.

In a final step a metal contact is placed over the contact layer KS above the ridge stripe waveguide BRS in the active waveguide regions AB1–AB3.

The semiconductor component BE2 in the second configuration example contains a first active waveguide region AB1, which separates into two partial waveguides with a Y-shaped branch in a passive waveguide region PB. Each of the two partial waveguides has a further active waveguide region AB2, AB3. Such an arrangement is used e.g. as the element for a cascaded optical space switch, as described in EP 616 243 A. If desired, a light signal which is radiated into the first active waveguide region AB1 can be routed further to one or both partial waveguides. In that case the first active waveguide region AB1 is used as input amplifier and the two further active waveguide regions AB2, AB3 are used as switches and can be controlled to be either optically transparent or opaque. A cascaded optical space switch can be constructed by combining a number of such semiconductor components BE2 on a common substrate.

Although the invention has been shown and described with respect to a best mode embodiment thereof, it should be understood by those skilled in the art that the foregoing and various other changes, omissions and additions in the form and detail thereof may be made therein without departing from the spirit and scope of the invention.

We claim:

1. A monolithic integrated optical semiconductor device (BE1, BE2) designed for light signals of an operating wavelength ($\lambda$), comprising:
   a substrate (SUB),
   an optical waveguide (BRS) disposed on said substrate (SUB), and
   a doped cap layer (DS) having an absorption coefficient for light signals of the operating wavelength ($\lambda$),
   wherein the optical waveguide (BRS)
      has an active, controllably light-amplifying or light-absorbing section (AB, AB1, AB2, AB3) and a passive, nonamplifying section (PB), and
      is a buried ridge stripe waveguide in both the active section (AB, AB1, AB2, AB3) and the passive section (PB),
   characterized in that
      in the passive section (PB), the optical waveguide (BRS) is covered by a cladding layer (MS),
      the cladding layer (MS) has an absorption coefficient for light signals of the operating wavelength ($\lambda$) less than the absorption coefficient of the cap layer (DS), and
      in the passive section (PB), the cladding layer (MS) is covered by the cap layer (DS).

2. An optical semiconductor device (BE1, BE2) as claimed in claim 1, characterized in that the cladding layer (MS) is made of semi-insulating or undoped semiconductor material.

3. An optical semiconductor device (BE1, BE2) as claimed in claim 1, characterized in that the refractive index of the cladding layer (MS) is equal to that of the cap layer (DS).

4. An optical semiconductor device (BE1, BE2) as claimed in claim 1, characterized in that the optical waveguide (BRS) is a continuous portion of a semiconductor layer structure deposited over the surface of the substrate.

5. An optical semiconductor device (BE1, BE2) as claimed in claim 1, characterized in that the optical waveguide (BRS) has a multiple-quantum-well semiconductor layer structure (MQW).

6. An optical semiconductor device (BE1, BE2) as claimed in claim 5, characterized in that the thickness of layers of the multiple-quantum well semiconductor layer structure (MQW) in the active section (AB, AB1, AB2, AB3) is greater than that in the passive section (PB).

7. An optical semiconductor device (BE1, BE2) as claimed in claim 1, characterized in that the substrate (SUB) is made of n-type InP and the cap layer (DS) of p-type InP, and that the optical waveguide contains ternary or quaternary layers of mixed crystals of the III/V compound type.

8. A process for fabricating an optical semiconductor device (BE1, BE2) having a buried ridge stripe waveguide comprising active, controllably light-amplifying or light-absorbing sections (AB, AB1, AB2, AB3) and passive, nonamplifying sections (PB), said process comprising the steps of:
   a) depositing a semiconductor layer structure patterned to form a ridge stripe waveguide (BRS) on a substrate (SUB);

b) depositing a cap layer (DS) over the entire surface of the patterned structure and a contact layer (KS) over the entire surface of the cap layer (DS); and c) depositing a metal contact (MK2) on the contact layer in the active sections (AB, AB1, AB2, AB3), characterized in that the following steps are carried out between steps a) and b):

i) covering the active sections (AB, AB1, AB2, AB3) with a dielectric layer (MASK);

ii) depositing a cladding layer (MS) of semi-insulating or undoped semiconductor material; and iii) removing the dielectric layer (MASK).

9. A process as claimed in claim 8, characterized in that the deposition of the semiconductor layer structure patterned to form a ridge stripe waveguide comprises the following steps:

a) depositing the semiconductor layer structure over the entire surface of the substrate (SUB);

b) forming active and passive waveguide sections from the semiconductor layer structure;

c) photolithically depositing an etch mask which covers the sections of the ridge stripe waveguide (BRS);

d) etching the semiconductor layer structure; and e) removing the etch mask.

10. A process as claimed in claim 8, characterized in that the deposition of the semiconductor layer structure patterned to form a ridge stripe waveguide comprises the following steps:

a) depositing a dielectric mask which is patterned using photolithographic and etching techniques in such a way that it bounds the sections of the ridge stripe waveguide (BRS) on both sides but does not cover said sections, and that in the active sections (AB, AB1, AB2, AB3) said mask is wider than in the passive sections (PB);

b) depositing the semiconductor layer structure by vapor-phase deposition of semiconductor material; and c) removing the dielectric mask.

\* \* \* \* \*

UNITED STATES PATENT AND TRADEMARK OFFICE
CERTIFICATE OF CORRECTION

PATENT NO. : 5,862,168
DATED : January 19, 1999
INVENTOR(S) : M. Schilling et al It is certified that error appears in the above-identified patent and that said Letters Patent is hereby corrected as shown below:

On the title page,
item [73], after "Alcatel Alsthom", please insert --Compagnie Generale d'Electricite--.

Signed and Sealed this

Seventeenth Day of August, 1999

Attest:

Q. TODD DICKINSON

Attesting Officer

Acting Commissioner of Patents and Trademarks